(12) United States Patent
Tong et al.

(10) Patent No.: US 10,333,265 B2
(45) Date of Patent: Jun. 25, 2019

(54) SPECTRAL BEAM COMBINED LASER SYSTEM AND METHOD

(71) Applicant: Changchun Institute of optics, Fine Mechanics and Physics, Chinese Academy of Sciences, Changchun, Jilin Province (CN)

(72) Inventors: Cunzhu Tong, Changchun (CN); Fangyuan Sun, Changchun (CN); Yufei Zhao, Changchun (CN); Shili Shu, Changchun (CN); Lijie Wang, Changchun (CN); Guanyu Hou, Changchun (CN); Sicong Tian, Changchun (CN); Lijun Wang, Changchun (CN)

(73) Assignee: CHANGCHUN INSTITUTE OF OPTICS, FINE MECHANICS AND PHYSICS, CHINESE ACADEMY OF SCIENCES, Changchun, Jilin Province (CN)

(*) Notice: Subject to any disclaimer, the term of this patent is extended or adjusted under 35 U.S.C. 154(b) by 0 days.

(21) Appl. No.: 16/048,880

(22) Filed: Jul. 30, 2018

(65) Prior Publication Data
US 2019/0157830 A1    May 23, 2019

(30) Foreign Application Priority Data

Nov. 22, 2017 (CN) .......................... 2017 1 1171795

(51) Int. Cl.
*H01S 3/08* (2006.01)
*H01S 5/10* (2006.01)
(Continued)

(52) U.S. Cl.
CPC .......... *H01S 3/08086* (2013.01); *H01S 3/067* (2013.01); *H01S 3/08009* (2013.01);
(Continued)

(58) Field of Classification Search
CPC .. H01S 3/08086; H01S 3/067; H01S 3/08009; H01S 3/2383; H01S 3/1096;
(Continued)

(56) References Cited

U.S. PATENT DOCUMENTS 6,192,062 B1   2/2001  Sanchez-Rubio et al.
6,665,471 B1 * 12/2003  Farmer ................. H01S 5/4062
                                                      372/102

(Continued)

OTHER PUBLICATIONS

O.B. Jensen et al., "Near-diffraction-limited segmented broad area diode laser based on off-axis spectral beam combining", Riso National Laboratory, Optics and Plasma Research Department, P.O. Box 49, 4000 Roskilde, Denmark, Appl. Phys. B 83, pp. 225-228 (2006), DOI: 10.1007/s00340-006-2159-4, English text, 4 pages.

*Primary Examiner* — Armando Rodriguez
(74) *Attorney, Agent, or Firm* — Rankin, Hill & Clark LLP

(57) ABSTRACT

The present invention provides a spectral beam combined laser system comprising an optical gain element array, a transform element, a diffraction element and a reflecting element, which are sequentially positioned in an optical path, wherein said optical gain element array comprises a plurality of gain elements radiate laser beams having different wavelength; said transform element focuses and spatially overlaps the laser beams received from said optical gain element array at said diffraction element; said diffraction element diffracts the laser beams spatially overlapped by the transform element to the reflecting element; and said reflecting element feeds back a portion of the laser beams to the optical gain element array in a V-shaped off-axis external cavity with off-axis angle, wherein said V-shaped off-axis external cavity is formed between the reflecting element and the optical gain element array.

16 Claims, 4 Drawing Sheets

(51) Int. Cl.
  *H01S 5/40* (2006.01)
  *H01S 5/14* (2006.01)
  *H01S 3/23* (2006.01)
  *H01S 3/067* (2006.01)
  *H01S 5/50* (2006.01)

(52) U.S. Cl.
  CPC .......... *H01S 3/2383* (2013.01); *H01S 5/1096* (2013.01); *H01S 5/143* (2013.01); *H01S 5/4012* (2013.01); *H01S 5/4025* (2013.01); *H01S 3/06758* (2013.01); *H01S 5/5027* (2013.01)

(58) Field of Classification Search
  CPC ...... H01S 3/143; H01S 3/4012; H01S 5/1096; H01S 5/143; H01S 5/4012
  See application file for complete search history.

(56) References Cited

U.S. PATENT DOCUMENTS

2009/0245305 A1\* 10/2009 Jensen .................. H01S 5/4062
                                                    372/29.011
2015/0331245 A1\* 11/2015 Tayebati ............ G02B 27/1006
                                                    359/634

\* cited by examiner

SPECTRAL BEAM COMBINED LASER SYSTEM AND METHOD

BACKGROUND OF THE INVENTION

Field of the Invention

The present invention relates to beam combined laser sources, more particularly to a spectral beam combined laser system and a method of generating an overlapped or coaxial optical beam using the spectral beam combined laser system.

The present application is based on patent application No. 201711171795.2 filed on Nov. 22, 2017 in China, the content of which are incorporated herein by reference.

Description of the Related Art

High-power or high-brightness lasers are desired in many applications, such as material processing, pumping of solid state lasers and fiber lasers, security and defense. However, it is difficult to realize high-power or high-brightness laser beams while a good beam quality of laser beams is maintained.

U.S. Pat. No. 6,192,062 describes a free space external cavity laser source, in which the laser is an on-axis feedback system and all the optical modes generated in the external cavity are reflected back indiscriminately by the partially reflecting element, thus the beam quality achieved is limited by the single element.

Jensen, et al., Near-diffraction-limited segmented broad area diode laser based on off-axis spectral beam combining, Applied Physics B, Vol. 83, Page 225-228, Mar. 17, 2006, describes laser based on off-axis feedback in combination with spectral beam combining method. While there is considerable loss of the emission of the laser because the spatial filter is used in the laser system, which results in the low power output.

SUMMARY OF THE INVENTION

In view of the above problems in the prior art, the present invention has been developed. The present invention is intended to provide a high-power or high-brightness spectral beam combined laser system that can generate an overlapped or coaxial laser beam with high quality.

A first aspect of the present invention provides a spectral beam combined laser system comprising an optical gain element array, a transform element having a focal plane, a diffraction element and a reflecting element, which are sequentially positioned in an optical path, wherein said optical gain element array comprises a plurality of gain elements that radiate laser beams having different wavelength; said transform element is positioned such that the focal plane of the transform element is at a reflecting rear facet of the optical gain element array, and the transform element focuses and spatially overlaps the laser beams received from said optical gain element array at said diffraction element; said diffraction element is positioned at the focal plane of the transform element and diffracts the laser beams spatially overlapped by the transform element to spectrally combine the laser beams to the reflecting element; and said reflecting element is positioned to intercept a portion of the laser beams diffracted by the diffraction element and feedback the intercepted laser beams to the optical gain element array in a V-shaped off-axis external cavity with off-axis angle, wherein said V-shaped off-axis external cavity is formed between the reflecting element and the optical gain element array.

Preferably, the optical gain element array is selected from the group consisting of a semiconductor laser array and a fiber laser array.

Preferably, the spectral beam combined laser system further comprising a wave shaping element positioned after the optical gain element array and before the transform element, for shaping the laser beams radiated from the optical gain element array.

Preferably, the wave shaping element includes a first shaping unit for shaping the laser beams in a first direction and a second shaping unit for shaping the laser beams in a second direction perpendicular to the first direction.

Preferably, the wave shaping element includes a third shaping unit for performing beam transformation to the laser beams having been shaped by the first shaping unit and the second shaping unit.

Preferably, the wave shaping element includes a first shaping unit for shaping the laser beams in a first direction and a third shaping unit for performing beam transformation to the laser beams having been shaped by the first shaping unit.

Preferably, the diffraction element is selected from the group of consisting of a reflective diffraction grating and a transmission diffraction grating.

Preferably, the off-axis angle is less than 10°.

Preferably, the off-axis angle is equal to or more than 1°.

A second aspect of the present invention provides a method of generating spectrally combined laser beams by a spectral beam combined laser system, the method comprising: a) radiating a plurality of laser beams having different wavelength in a V-shaped off-axis external cavity with an off-axis angle, by an optical gain element array; b) focusing the radiated plurality of laser beams and causing the laser beams being spatially overlapped with each other; c) diffracting the spatially overlapped laser beams to cause the laser beams being spectrally overlapped; d) intercepting a portion of the diffracted laser beams to feed back the intercepted laser beams in the V-shaped off-axis external cavity by a reflecting element, wherein the V-shaped off-axis external cavity is formed between the reflecting element and the optical gain element array; and e) outputting underneath the reflecting element, as output laser beam, the laser beams subjected to feedback in the V-shaped off-axis external cavity.

Preferably, the method further including a step of shaping the plurality of laser beams radiated by the optical gain element array, after step a) and before step b).

Preferably, the step of shaping the laser beams comprises a step of shaping the laser beams in a first direction and shaping the laser beams in a second direction perpendicular to the first direction.

Preferably, the step of shaping the laser beams further comprises a step of performing beam transformation to the laser beams having been shaped in the first direction and the second direction.

Preferably, the step of shaping the laser beams comprises a step of shaping the laser beams in a first direction and performing beam transformation to the laser beams having been shaped in the first direction.

Preferably, the off-axis angle is less than 10°.

Preferably, the off-axis angle is equal to or more than 1°.

According to configuration of the present invention, high-power or high-brightness multi-wavelength overlapping or coaxial optical beam can be achieved.

BRIEF DESCRIPTION OF THE DRAWINGS

To describe the technical solutions in the embodiments of the present application more clearly, the accompanying drawings required for describing the embodiments will be explained briefly below. Apparently, the accompanying drawings in the following description show merely some embodiments recorded in the present application, and for those skilled in the art, other accompanying drawings may also be obtained based on these accompanying drawings without any creative work.

DESCRIPTION OF THE EMBODIMENTS

Figure 1:
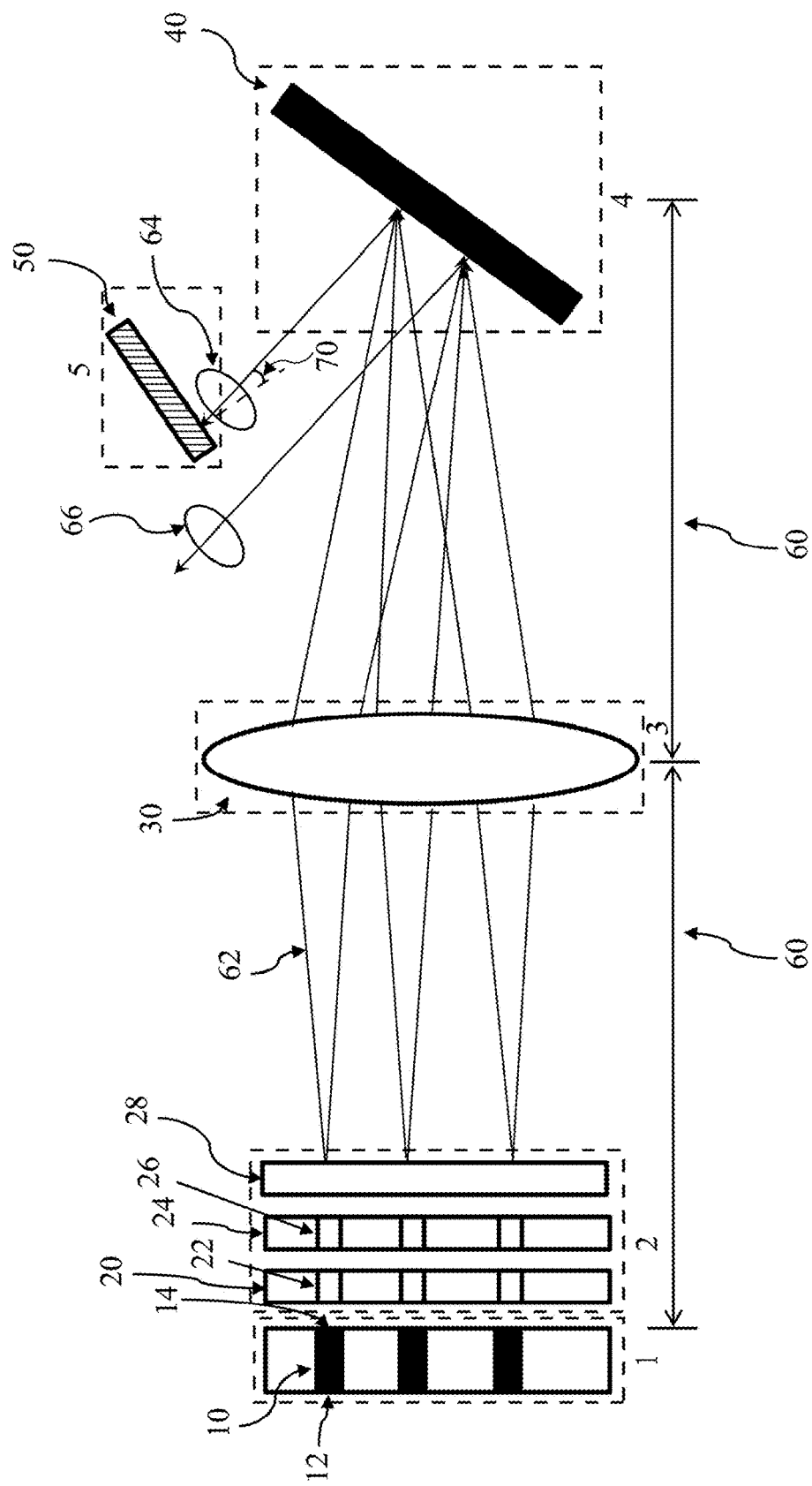
FIG. 1 is a schematic diagram showing a spectral beam combined laser system according to one embodiment of the present invention.

Hereinafter, embodiments of the present invention will be described in detail with reference to the accompanying drawings. It should be understood that the following embodiments are not intended to limit the invention, and that all combinations of the aspects described in the following embodiments are not necessarily required with respect to the means of solving the problems according to the invention. For the sake of simplicity, the similar reference numerals or signs are used for the similar structural portions or steps, and the description thereof is omitted.

The following list of reference symbols may be used in conjunction with the drawings:

1 Optical gain element array
2 Wave shaping element
3 Transform element
4 Diffraction element
5 Reflecting element
10 Gain element
12 Reflecting rear facet
14 Antireflective front facet
20 First shaping unit
22 Fast axis collimation lens (FAC)
24 Second shaping unit
26 Slow axis collimation lens (SAC)
28 Third shaping unit
30 Transform lens (TL)
40 Reflective Diffraction grating (RDG)
42 Transmission diffraction grating (TDG)
50 High reflectivity mirror (HR mirror)
60 Focal length of the transform lens (TL)
62 Optical path
64 Incident laser beams
66 Output laser beams
70 Off-axis reflecting angle

First Embodiment

The first embodiment of the spectral beam combined laser system according to the present invention and the operation method thereof will be described below in detail with reference to the attached drawings.

FIG. 1 illustrates a schematic diagram of a spectral beam combined laser system according to the first embodiment of the present invention. As shown in FIG. 1, the laser system may include an optical gain element array 1, a wave shaping element 2, a transform element 3, a diffraction element 4 and a reflecting element 5.

The optical gain element array 1 is the gain media of the laser system, and may be a linear array or a stack array. The optical gain element array 1 may include a plurality of gain elements 10. The plurality of gain element 10 are arranged in equal center-to-center spacing so as to reduce cross talk between the gain element. Alternatively, the plurality of gain element 10 may be arranged in unequal center-to-center spacing. Each of the gain element 10 may be same or different gain media. Any optical gain media may be used, such as laser diode (LD), fiber laser, etc. The gain media must, however, have sufficient gain and sufficient gain bandwidth to overcome optical losses at the desired lasing wavelengths.

The gain elements 10 are pumped with energy which is typically provided by electrical current or optical radiation. Each of the gain element 10 radiates laser beams having different wavelength and different free space optical path, respectively.

In addition, the optical gain element array 1 may be multi-mode semiconductor laser amplifiers having stripes of active gain media. Alternatively, the optical gain element array 1 may include a plurality of discrete multi-mode semiconductor amplifiers. In another embodiment, the optical gain element array 1 may include a plurality of fiber amplifiers.

The optical gain element array 1 has a reflecting rear facet 12 and a substantially antireflective front facet 14. In another embodiment, the reflecting rear facet 12 is substantially totally reflecting. Each of the gain elements 10 emits a laser beam in different optical paths 62.

The wave shaping element 2 is used for shaping the laser beams emitted from the optical gain element array 1, and may include a first shaping unit 20, a second shaping unit 24 and a third shaping unit 28. The wave shaping element 2 can reduce the fast axis divergence angle and the slow axis divergence angle of laser beams emitted by corresponding gain element respectively, and rotate the laser beams radiated from all of the gain element by 90°.

The first shaping unit 20 is for shaping the laser beams radiated by the optical gain element array 1 in a first direction. For example, the first shaping unit 20 may be a fast axis collimation lens (FAC) array, for reducing the fast axis divergence angle of laser beams emitted from the optical gain element array 1. In this case, the first shaping unit 20 includes a plurality of fast axis collimation lenses (FAC) 22 of which the number is equal to the number of the gain elements 10 included in optical gain element array 1. Each of the FAC 22 is positioned in the optical paths 62 behind corresponding gain element 10, and each of the FAC 22 has substantially antireflective coating so as to reduce the reflection of the laser beam emitted from corresponding gain element.

The second shaping unit 24 is for shaping the laser beams in a second direction. For example, the second shaping unit 24 may be a slow axis collimation lens (SAC) array, for reducing the slow axis divergence angle of laser beams which had passed through the first shaping unit 20. In this case, the SAC array includes a plurality of slow axis collimation lens (SAC) 26 of which the number is equal to the number of the gain elements 10 included in optical gain element array 1. Each of the SAC 26 is positioned in the optical paths 62 behind the corresponding FAC 22, and each of the SAC 26 has substantially antireflective coating so as to reduce the reflection of the laser beam emitted from corresponding gain element.

In present embodiment, the number of lens included in the FAC array and the SAC array are both equal to the number of the gain elements 10 included in optical gain element array 1. Alternatively, the number of lens included in the FAC array and the SAC array may be more than the number of the gain elements included in optical gain element array 1 respectively.

The third shaping unit 28 is for performing beam transformation to laser beams, such as exchanging the fast axis direction and slow axis direction of laser beams. In addition, the third shaping unit 28 may include a beam transformation mirror (BTM). The BTM is positioned in the optical paths 62 behind the second shaping unit 24, and exchanges the fast axis direction and slow axis direction of laser beams which is collimated in the fast axis direction by the FAC 22 and collimated in the slow axis direction by the SAC 24.

In present embodiment, the wave shaping element 2 includes the first shaping unit 20, the second shaping unit 24 and the third shaping unit 28. Specifically, a FAC array is taken as an example of the first shaping unit, and a SAC array is taken as an example of the second shaping unit. However, the present invention does not limit to this. Alternatively, the wave shaping element 2 may only include the first shaping unit 20 and the third shaping unit 28, and the first shaping unit 20 may be, for example, a FAC array so as to reduce the fast axis divergence angle of laser beams.

In addition, the wave shaping element 2 is used in present embodiment, however, the wave shaping element 2 is not necessary in the spectral beam combined laser system. For example, if the beam quality of laser beams radiated by gain elements 10 is good (nearly diffraction limited), the wave shaping element 2 could be omitted.

The transform element 3 having a focal plane is positioned in the optical paths 62 between the wave shaping element 2 and the diffraction element 4, and is used to focus the laser beams shaped by the wave shaping element 2 and make the laser beams be spatially overlapped at the diffraction element 4. Alternatively, the transform element 3 may include a transform lens (TL) 30, and the transform lens (TL) 30 is positioned in the optical paths 62 between BTM and RDG 40. Preferably, in the embodiment of the present invention, the distance between TL 30 and the antireflective front facet 14 equals to the distance between TL 30 and RDG 40, which is substantially the focal length of TL 30. The transform element 3 may include a refractive element. In another embodiment, the transform element 3 may include a reflecting element.

The diffraction element 4 is used to diffract the spatially overlapped laser beams which had passed through TL 30, and combine laser beams to the reflecting element 5. The diffraction element 4 is positioned in the optical paths 62 and substantially a focal length 60 away from the transform lens (TL) 30, so that the beams passed through TL 30 are spatially overlapped onto the diffraction element 4, and then diffracted by the diffraction element 4. The diffracted laser beams are spectrally overlapped and incident on the reflecting element 5. In the present embodiment, the diffraction element 4 may be a reflective diffraction grating (RDG) 40. Alternatively, the diffraction element 4 may be a transmission diffraction grating (TDG) 42.

The reflecting element 5 is positioned to intercept a portion of laser beams diffracted by the diffraction element 4. The reflecting element 5 may include a high reflectivity mirror (HR mirror) 50 which reflects the incident laser beams 64. The reflecting element 5 is used for supplying partial feedback with an off-axis reflecting angle 70, which equals to the incident angle of the incident laser beams 64 that incidents on the reflecting element 5, or a complementary angle of the incident angle of the incident laser beams 64. The partial feedback is realized by the overlapping portion between the laser beam and the reflecting element 5.

Now the partial feedback is described below with reference to FIG. 2.

Figure 2:
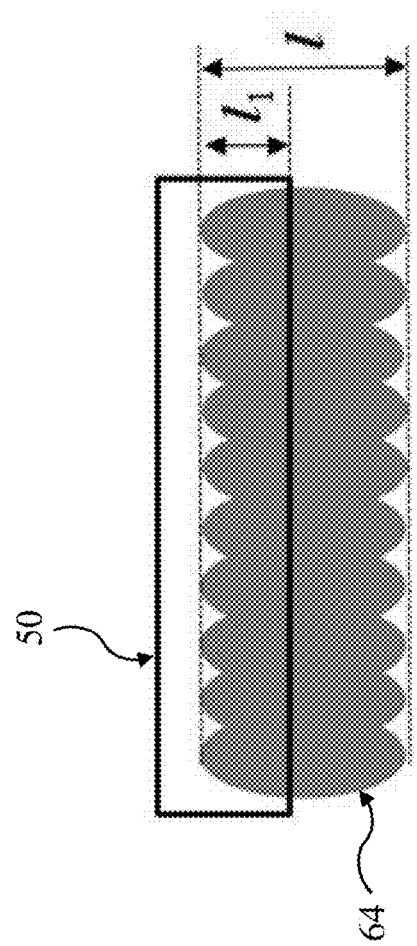
FIG. 2 is a schematic diagram showing feedback laser beams incident on a reflecting element of the spectral beam combined laser system.

As shown in FIG. 2, the height of the incident laser beams 64 is l, and the overlapped portion between the incident laser beams 64 and the reflecting element 5 is $l_1$. In the present invention, the partial feedback means that a portion of the incident laser beams 64 overlapped with the reflecting element 5, is fed back by the reflecting element 5. Too small overlapping leads to an unstable combination, while large overlapping will reduce the combined power. In FIG. 2, the overlapped portion of which the height is $l_1$ fed back by the reflecting element 5. The partial feedback could be adjusted by changing the size of overlapping portion $l_1$, and the size of overlapping portion $l_1$ could be adjusted by adjusting the position or direction of the reflecting element 5. In addition, the partial feedback may be adjusted by rotating a screw arranged on a mounting frame holding the reflecting element 5. For example, the measured laser beam height l is 9.0 mm, then a stable combining can be realized when the value of overlapped portion $l_1$ is larger than 3.32 mm, and the power performance of output laser beams 66 is also the best at overlapped portion $l_1$ of 3.32 mm.

Figure 3:
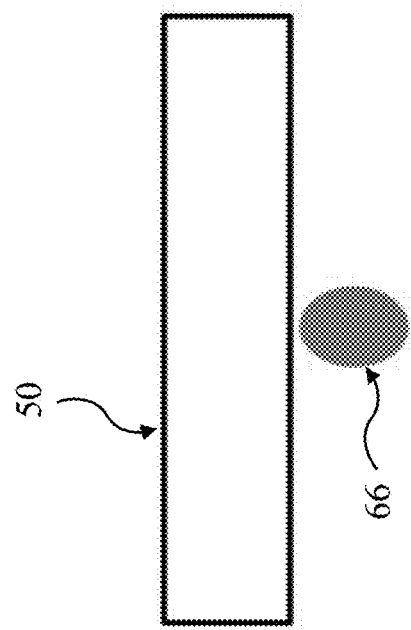
FIG. 3 is a schematic diagram showing output laser beams.

Now the output of laser beams will be explained referring to FIGS. 1 and 3. The output laser beams 66 underneath the reflecting element 5 could be adjusted by changing the off-axis reflecting angle 70 shown in FIG. 1. By adjusting the off-axis reflecting angle 70 to an appropriate value, the combining of laser beams and output with a single lobe emission underneath the HR mirror as shown in FIG. 3, is able to be realized. The off-axis reflecting angle 70 may be adjusted by adjusting the reflecting element 5. For example, the off-axis reflecting angle 70 may be adjusted by rotating a screw arranged on a mounting frame holding the reflecting element 5. The off-axis reflecting angle 70 is in the order of several degrees, for example, the off-axis reflecting angle 70 is less than 10°, preferably, the off-axis reflecting angle 70 is less than 10° and equal to or more than 1°. In one embodiment, the off-axis reflecting angle 70 is 3.6°.

Next, the explanation regarding how the laser beam is generated and output from the spectral beam combined laser system of the present invention will be given with reference to FIG. 1.

Firstly, the laser beams radiated from the optical gain element array 1 are shaped by the wave shaping element 2. Then the shaped laser beams are focused by the transform element 3 on the diffraction element 4, which will spectrally combine the laser beams onto the reflecting element 5. The reflecting element 5 and the reflecting rear facet 12 of the optical gain element array 1 constitute a V-shaped cavity with the off-axis reflecting angle 70.

A portion of the incident laser beams 64 diffracted by the diffraction element 4 (feedback laser beams) will be fed back by the reflecting element 5 and return to the gain elements 10 after sequentially passing through the diffraction element 4, the transform element 3 and the wave shaping element 2, and amplified by each gain element 10 again. Then the amplified laser beams are reflected back to the wave shaping element 2 by the reflecting rear facet 12, pass through the wave shaping element 2 and the transform element 3, then are diffracted by the diffraction element 4 onto the reflecting element 5 again. This feedback process will repeat until the incident laser beam 64 turns into output laser beam 66 which could be outputted underneath the reflecting element 5 due to the existence of the off-axis reflecting angle 70. In other words, the output laser beams 66 are such laser beams which is diffracted by the diffraction element 4 to be directly outputted from the V-shaped cavity, without being incident on the reflecting element 5.

In the embodiment of the present invention, the laser beams radiated from the optical gain element array 1, along the optical path 62, all pass through the third shaping unit beam 28 (for example, a beam transformation mirror (BTM)) and the transform lens (TL) 30, then are diffracted by reflective diffraction grating (RDG) 40. That is, all laser beams radiated from the optical gain element array 1 follows corresponding optical paths 62 and share beam transformation mirror (BTM), transform lens (TL) 30 and reflective diffraction grating (RDG) 40. While the laser beams radiated from one gain element 10 of the optical gain element array 1 only pass through corresponding one of the fast axis collimation lens (FAC) 22 and corresponding one of the slow axis collimation lens (SAC) 26, respectively.

A Method of Generating Overlapped Laser Beams According to First Embodiment

A method of generating high power and high beam quality overlapped laser beams using a spectral beam combined laser system includes providing a V-shaped off-axis external cavity. At least two gain elements and a reflecting element are included in a cavity, wherein the gain elements are positioned in one end of the cavity and the reflecting element is positioned in another end of the cavity. A wave shaping element (optional) for shaping the plurality of laser beams radiated by the gain elements, a transform element for focusing the radiated plurality of laser beams and causing the laser beams being spatially overlapped with each other, and a diffraction element for diffracting the spatially overlapped laser beams to cause the laser beams being spectrally overlapped are positioned in the cavity.

More details about the method will be described as follows referring to FIG. 4.

Step S101: a radiating step of radiating a plurality of laser beams having different wavelength in a V-shaped off-axis external cavity with an off-axis angle, by an optical gain element array.

Specifically, the optical gain element array 1 including a plurality of gain elements 10 radiate a plurality of laser beams, at least two of the plurality of laser beams having different wavelength.

Step S102: a shaping step of shaping the laser beams in a first direction and shaping the laser beams in a second direction perpendicular to the first direction. Wherein, the step S102 is an optional step that can be cancelled or replaced by other step. For example, if the beam quality of laser beams radiated by the gain elements 10 is good (nearly diffraction limited), the step S102 may be omitted.

Specifically, the plurality of laser beams are propagated to the wave shaping element 2 including a first shaping unit 20, a second shaping unit 24 and a third shaping unit 28. The wave shaping element 2 can shape the laser beams emitted from the optical gain element array 1, for example, reduce the fast axis divergence angle and the slow axis divergence angle of the laser beam radiated from corresponding gain element 10, with the first shaping unit and the second shaping unit respectively, and rotate the laser beams shaped by the first and second shaping units by 90°.

Step S103: a focusing step of focusing the radiated plurality of laser beams and causing the laser beams being spatially overlapped with each other.

Specifically, the plurality of laser beams are propagated to the transform element 3, the distance between the transform element 3 and the antireflective front facet 14 of the optical gain element array 1 equals to the focal length of the transform element 3. The transform element 3 focuses the laser beams and causes the laser beams being spatially overlapped with each other.

Step S104: a diffraction step of diffracting the spatially overlapped laser beams to cause the laser beams being spectrally overlapped.

Specifically, after the plurality of laser beams shaped by the wave shaping element 2 are propagated to the transform element 3, which focuses the laser beams to make the laser beams be spatially overlapped on the diffraction element 4, the diffraction element 4 diffracts the spatially overlapped laser beams so as to cause the laser beams being spectrally overlapped and incident on the reflecting element.

Step S105: intercepting step of intercepting a portion of the diffracted laser beams to feed back the intercepted laser beams in the V-shaped off-axis external cavity by a reflecting element, wherein the V-shaped off-axis external cavity is formed between the reflecting element and the optical gain element array.

Specifically, the plurality of laser beams diffracted by the diffraction element 4 are propagated to the reflecting element 5. The reflecting element 5 supplies partial feedback with an off-axis reflecting angle 70, the reflecting element 5 and the reflecting rear facet 12 of the optical gain element array 1 together forming a V-shaped off-axis external cavity that produces a plurality of laser beams having different wavelengths.

Step S106: outputting step of outputting underneath the reflecting element, as output laser beam, the laser beams subjected to feedback in the V-shaped off-axis external cavity.

Specifically, laser beams which had been subjected feedback by the V-shaped off-axis external cavity is outputted as output laser beams 66 underneath the reflecting element 5 as shown in FIG. 3, without being incident on the reflecting element 5.

With the configuration of the laser system of the present invention, overlapping or coaxial laser beam with high quality, high-power or high-brightness can be achieved.

Second Embodiment

Figure 5:
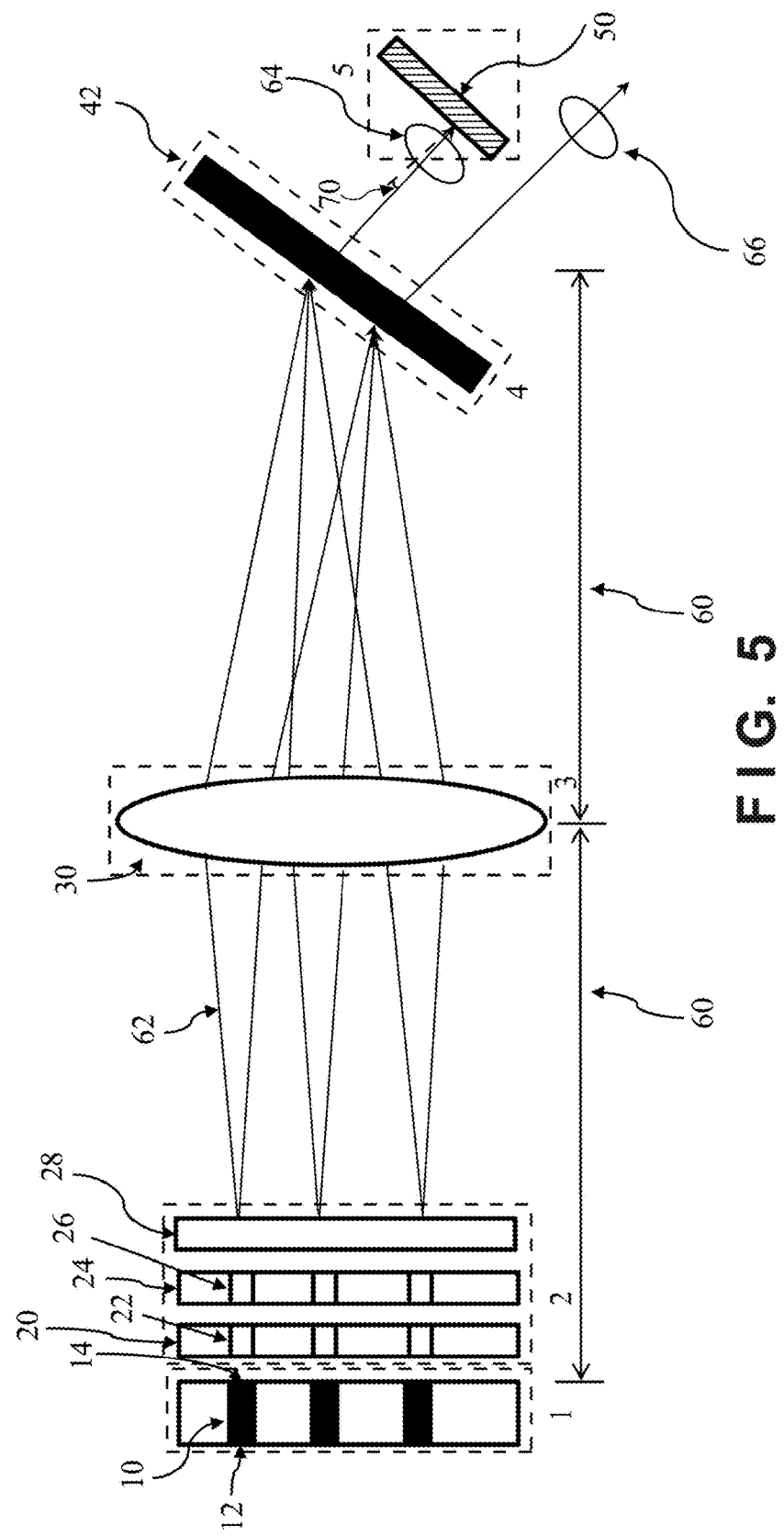
FIG. 5 is a schematic diagram of the spectral beam combined laser system according to another embodiment of the present invention.

Next another embodiment of a spectral beam combined laser system according to the present invention will be illustrated with FIG. 5. FIG. 5 illustrates a schematic diagram of a spectral beam combined laser system according to the second embodiment of the present invention.

Figure 4:
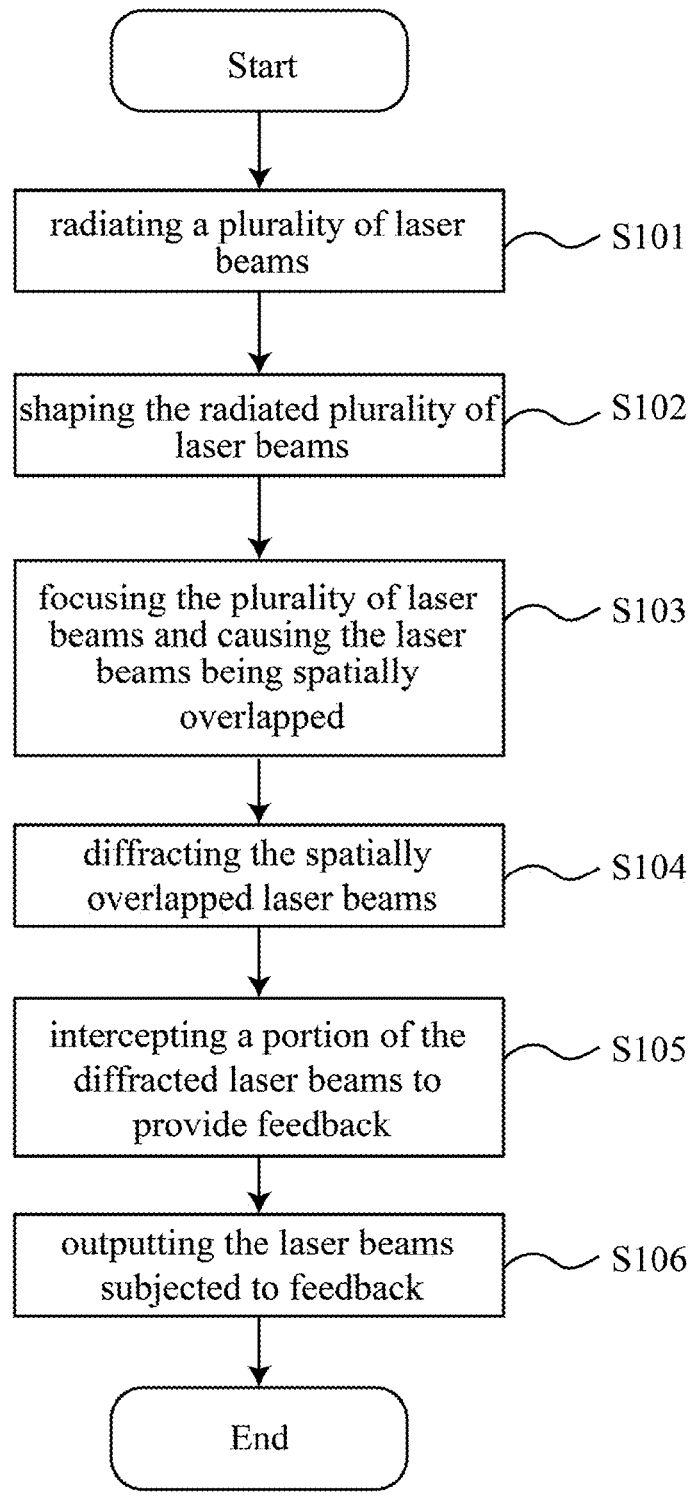
FIG. 4 is a flowchart illustrating a method for spectrally combining laser beams in the spectral beam combined laser system of the present invention.

The configuration of the spectral beam combined laser system in FIG. 4 is similar to that in FIG. 1, and the difference between them is that the reflective diffraction grating (RDG) 40 in FIG. 1 is replaced by a transmission diffraction grating (TDG) 42, and the position of the high reflectivity mirror 50 is correspondingly changed so that the high reflectivity mirror 50 can provide partial feedback to the laser beams. In addition, the transmission diffraction grating (RDG) 42 is positioned in the optical paths 62 and substantially a focal length 60 away from the transform lens (TL) 30.

In this embodiment, the spatially overlapped laser beams focused by the Transform lens (TL) 30 go through the first transmission diffraction grating 42, and are spectrally combined to the reflecting element 5. The reflecting element 5 provides partial feedback as described in the first embodiment of present invention. In addition, the output laser beams 66 are outputted in the same manner as described in the first embodiment of present invention.

According to above configuration, the present invention teaches a spectral beam combined laser system that can generate high-power and high beam quality laser beams. The laser system includes a V-shaped off-axis external cavity that can generate an overlapped or coaxial laser beam. The laser system can be constructed with a laser array, a wave shaping element (optional), a transform element, a diffraction element, and a reflecting element.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A spectral beam combined laser system comprising an optical gain element array, a transform element having a focal plane, a diffraction element and a reflecting element, wherein said optical gain element array, said transform element, said diffraction element, and said reflecting element are sequentially positioned in an optical path, wherein
    said optical gain element array comprises a plurality of gain elements that radiate laser beams having different wavelengths;
    said transform element is positioned such that the focal plane of the transform element is at a reflecting rear facet of the optical gain element array, and the transform element focuses and spatially overlaps the laser beams received from said optical gain element array at said diffraction element;
    said diffraction element is positioned at the focal plane of the transform element and diffracts the laser beams spatially overlapped by the transform element to spectrally combine the laser beams to the reflecting element; and
    said reflecting element is positioned to intercept a portion of the laser beams diffracted by the diffraction element and feedback the intercepted laser beams to the optical gain element array in a V-shaped off-axis external cavity with an off-axis reflecting angle, wherein said V-shaped off-axis external cavity with the off-axis reflecting angle is formed between the reflecting element and the optical gain element array such that the laser beams subjected to feedback by the V-shaped off-axis external cavity are output underneath the reflecting element as output laser beams by said diffraction element.

2. The spectral beam combined laser system according to claim 1, wherein the optical gain element array is selected from the group consisting of a semiconductor laser array and a fiber laser array.

3. The spectral beam combined laser system according to claim 1, further comprising a wave shaping element positioned after the optical gain element array and before the transform element, for shaping the laser beams radiated from the optical gain element array.

4. The spectral beam combined laser system according to claim 3, wherein the wave shaping element includes a first shaping unit for shaping the laser beams in a first direction and a second shaping unit for shaping the laser beams in a second direction perpendicular to the first direction.

5. The spectral beam combined laser system according to claim 4, wherein the wave shaping element includes a third shaping unit for performing beam transformation to the laser beams having been shaped by the first shaping unit and the second shaping unit.

6. The spectral beam combined laser system according to claim 3, wherein the wave shaping element includes a first shaping unit for shaping the laser beams in a first direction and a third shaping unit for performing beam transformation to the laser beams having been shaped by the first shaping unit.

7. The spectral beam combined laser system according to claim 1, wherein the diffraction element is selected from the group of consisting of a reflective diffraction grating and a transmission diffraction grating.

8. The spectral beam combined laser system according to claim 1, wherein the off-axis angle is less than 10°.

9. The spectral beam combined laser system according to claim 8, wherein the off-axis angle is equal to or more than 1°.

10. A method of generating spectrally combined laser beams by a spectral beam combined laser system, the method comprising:
    a) radiating a plurality of laser beams having different wavelength in a V-shaped off-axis external cavity with an off-axis angle, by an optical gain element array;
    b) focusing the radiated plurality of laser beams and causing the laser beams being spatially overlapped with each other;
    c) diffracting the spatially overlapped laser beams to cause the laser beams being spectrally overlapped;
    d) intercepting a portion of the diffracted laser beams to feed back the intercepted laser beams in the V-shaped off-axis external cavity by a reflecting element, wherein the V-shaped off-axis external cavity is formed between the reflecting element and the optical gain element array; and
    e) outputting underneath the reflecting element, as output laser beam, the laser beams subjected to feedback in the V-shaped off-axis external cavity.

11. The method according to claim 10, further comprising a step of shaping the laser beams radiated by the optical gain element array, after step a) and before step b).

12. The method according to claim 11, wherein the step of shaping the laser beams comprises a step of shaping the laser beams in a first direction and shaping the laser beams in a second direction perpendicular to the first direction.

13. The method according to claim 12, wherein the step of shaping the laser beams further comprises a step of performing beam transformation to the laser beams having been shaped in the first direction and the second direction.

14. The method according to claim 10, wherein the step of shaping the laser beams comprises a step of shaping the laser beams in a first direction and performing beam transformation to the laser beams having been shaped in the first direction.

15. The method according to claim 10, wherein the off-axis angle is less than 10°.

16. The method according to claim 15, wherein the off-axis angle is equal to or more than 1°.

* * * * *